(12) United States Patent
Lee

(10) Patent No.: US 7,732,838 B2
(45) Date of Patent: Jun. 8, 2010

(54) SEMICONDUCTOR DEVICE AND MANUFACTURING METHOD THEREOF

(75) Inventor: Sang Bum Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/463,938

(22) Filed: May 11, 2009

(65) Prior Publication Data

US 2009/0212328 A1 Aug. 27, 2009

Related U.S. Application Data

(62) Division of application No. 11/481,103, filed on Jul. 5, 2006, now Pat. No. 7,582,548.

(30) Foreign Application Priority Data

Jul. 5, 2005 (KR) .................... 10-2005-0060332

(51) Int. Cl.
H01L 27/10 (2006.01)
H01L 29/739 (2006.01)
H01L 29/76 (2006.01)
H01L 29/94 (2006.01)
H01L 31/062 (2006.01)
H01L 31/113 (2006.01)
H01L 31/119 (2006.01)

(52) U.S. Cl. ............... 257/202; 257/365; 257/366; 257/E29.15; 257/E29.152

(58) Field of Classification Search ............ 257/202, 257/365–366, E29.15, E29.152
See application file for complete search history.

(56) References Cited

U.S. PATENT DOCUMENTS 6,384,450 B1 5/2002 Hidaka et al.
6,531,350 B2 * 3/2003 Satoh et al. ............. 438/197
6,580,137 B2 * 6/2003 Parke ..................... 257/401
6,613,621 B2 * 9/2003 Uh et al. ................. 438/183
6,870,230 B2 3/2005 Matsuda et al.
6,930,743 B2 8/2005 Park et al.
6,977,228 B2 * 12/2005 Kohyama et al. ......... 438/706
7,067,379 B2 * 6/2006 Wen et al. ............... 438/300
7,265,011 B2 * 9/2007 Yoon et al. .............. 438/217
7,633,127 B2 * 12/2009 Wen et al. ............... 257/384
2003/0119243 A1 * 6/2003 Shin et al. ............... 438/200
2004/0041202 A1 * 3/2004 Kim et al. ............... 257/316
2005/0130352 A1 * 6/2005 Maldei et al. ........... 438/128

(Continued)

*Primary Examiner*—Ida M Soward
(74) *Attorney, Agent, or Firm*—Saliwanchik, Lloyd & Saliwanchik

(57) ABSTRACT

A semiconductor device is provided. The semiconductor device includes a first gate line, a second gate line, a first contact electrode, first dummy gates, a second gate pad, and a second contact electrode. The first gate line is formed on a semiconductor substrate and the second gate line of a spacer shape is formed on the sidewalls of the first gate line with a thin insulating layer interposed therebetween. The first contact electrode is vertically connected with the first gate line. The first dummy gates are formed in array spaced a predetermined interval from the first gate line on the semiconductor substrate. The second gate pad of a spacer shape is formed on the sidewalls of the first dummy gates with a thin insulating layer interposed therebetween. The second gate pad is connected to the second gate line and is also gap-filled between the first dummy gates. The second contact electrode is vertically connected with the second gate pad.

7 Claims, 4 Drawing Sheets

U.S. PATENT DOCUMENTS

2005/0167762 A1    8/2005  Kadoshima et al.
2006/0131656 A1 *  6/2006  Shin et al. ................... 257/369
2007/0241386 A1 *  10/2007 Wang et al. ................. 257/314

* cited by examiner

SEMICONDUCTOR DEVICE AND MANUFACTURING METHOD THEREOF

CROSS-REFERENCE TO RELATED APPLICATIONS

This application is a divisional of U.S. application Ser. No. 11/481,103, filed Jul. 5, 2006 now U.S. Pat. No. 7,582,548, which claims the benefit of Korean Application No. 10-2005-060332, filed Jul. 5, 2005, which are incorporated herein by reference in their entirety.

FIELD OF THE INVENTION

The present invention relates to a semiconductor device and a method of manufacturing a semiconductor device, and more particularly, to a semiconductor device and a manufacturing method thereof, capable of reducing a gate line critical dimension (CD) of a highly integrated semiconductor device.

BACKGROUND OF THE INVENTION

Generally, a transistor of a metal-oxide-semiconductor (MOS) structure includes a gate electrode (hereinafter, referred to as "gate line") formed in a line shape on a semiconductor substrate such as a silicon substrate, and source/drain regions formed by doping portions of the semiconductor substrate that are exposed at both sides of the gate line with n-type or p-type impurities. A linewidth of the gate electrode is determined according to a design rule. As semiconductor devices become highly integrated, the linewidth of the gate electrode reduces.

According to a method of manufacturing a gate line contact of a semiconductor device of a prior art, a device isolation layer is formed on a silicon substrate by a shallow trench isolation (STI) process to isolate an active region from an inactive region. Next, a plurality of gate lines are formed on the substrate, and a spacer formed of an insulating material (for example, a silicon nitride layer) is formed on both sidewalls of the gate line. Conductive impurities are then ion-implanted into the substrate to form source/drain regions. Next, an interlayer insulating layer is formed on the entire surface of the substrate, and a contact electrode connected with the gate line or the source/drain regions is formed in the interlayer insulating layer. Then, a line connected with the contact electrode is formed on the interlayer insulating layer.

The above method is commonly used for manufacturing a memory device such as a dynamic random access memory (DRAM) device, where transistors having the above-described MOS structure are arranged in a matrix form. Referring to FIG. 1, the device includes a contact electrode 30 connected with a gate line 20 and formed in a peripheral circuit region 40. The contact electrode 30 is vertically connected with a power source line for providing a predetermined voltage to the gate line 20 formed in a cell array region 10.

However, as the semiconductor device becomes highly integrated, a memory device having a plurality of gate lines has a limitation in reducing a linewidth of a gate line formed on a surface of a substrate of the memory device. Accordingly, a method is under development to reduce a linewidth of the gate line by forming a secondary gate line of a spacer shape with a thin insulating layer interposed on sidewalls of the gate line on the substrate. Therefore, power supply to the secondary gate line becomes an issue.

SUMMARY OF THE INVENTION

Accordingly, the present invention is directed to a semiconductor device and a manufacturing method thereof that addresses and/or substantially obviates one or more problems, limitations, and/or disadvantages of the prior art.

An object of the present invention is to provide a semiconductor device that can provide a sufficient voltage even to a spacer shaped gate line with a reduced critical dimension.

Another object of the present invention is to provide a method of manufacturing a semiconductor device that can provide a sufficient voltage even to a spacer shaped gate line with a reduced critical dimension.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a semiconductor device incorporating: a first gate line formed on a semiconductor substrate; a second gate line of a spacer shape formed on the sidewalls of the first gate line with a thin insulating layer interposed therebetween; a first contact electrode vertically connected with the first gate line; an array of first dummy gates spaced a predetermined interval from the first gate line and formed on the semiconductor substrate; a second gate pad of a spacer shape formed on the sidewalls of the first dummy gates with a thin insulating layer interposed therebetween, the second gate pad being connected with the second gate line and gap-filled between the first dummy gates; and a second contact electrode vertically connected with the second gate pad.

In another aspect of the present invention, there is provided a method of manufacturing a semiconductor device including: forming a first gate line and an array of first dummy gates spaced a predetermined interval from the first gate line oil a semiconductor substrate; forming a thin insulating layer on the sidewalls of the first gate line and each of the first dummy gates; forming a second gate line of a spacer shape on the thin insulating layer on the sidewalls of the first gate line and forming a second gate pad of a spacer shape on the thin insulating layer on the sidewalls of the first dummy gates, where the second gate pad is connected with the second gate line and gap-filled between the first dummy gates; and forming a first contact electrode vertically connected with the first gate line and a second contact electrode vertically connected with the second gate pad.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
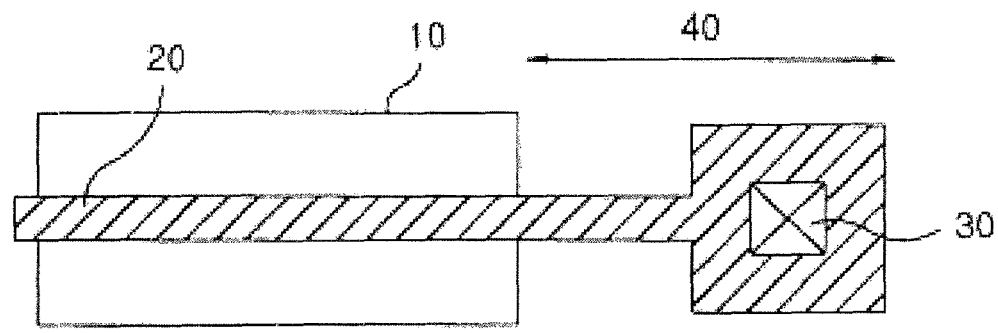
FIG. 1 is a plan view illustrating a general structure of a gate line of a semiconductor device.
Figure 2A:
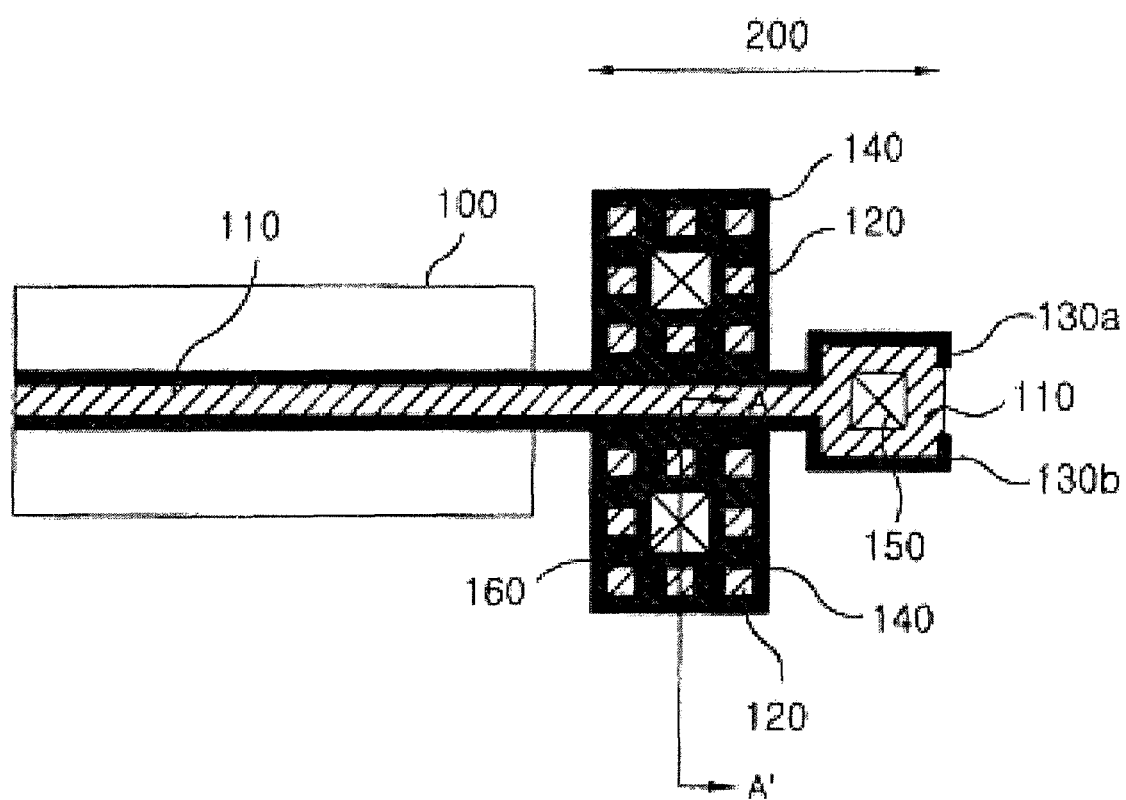
FIG. 2A is a plan view illustrating a structure of a semiconductor device according to an embodiment of the present invention.
Figure 2B:
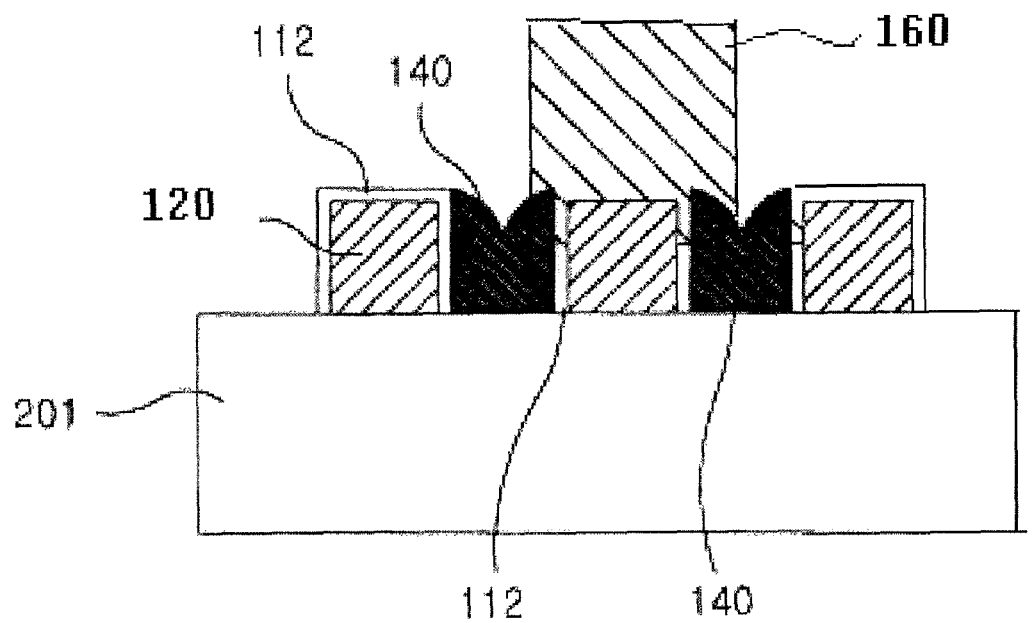
FIG. 2B is a cross-sectional view illustrating a structure of a semiconductor device according to an embodiment of the present invention.

FIG. 2A is a plan view illustrating a structure of a semiconductor device according to an embodiment of the present invention. FIG. 2B is an embodiment of a cross-sectional view taken along the line A-A' of FIG. 2A.

Referring to FIGS. 2A and 2B, a semiconductor device according to an embodiment of the present invention can incorporate a first gate line 110 formed in a linear shape in a cell region 100 and a peripheral circuit region 200 on a semiconductor substrate. Second gate lines 130a and 130b of a spacer shape can be formed with a thin insulating layer 112 interposed on sidewalls of the first gate line 110.

The second gate lines 130a and 130b can be formed as a single gate line on both sidewalls of the first gate line 110 and can be separated apart into two gate lines 130a and 130b. Therefore, second gate line 130a and second gate line 130b can perform separate functions.

A first contact electrode 150 can be vertically connected with an end portion of the first gate line 110 in the peripheral circuit region 200. In embodiments, the peripheral circuit region 200 can correspond to an outer edge of the semiconductor substrate.

A plurality of first dummy gates 120 and a second gate pad 140 can be formed on the semiconductor substrate. The plurality of first dummy gates 120 can be spaced a predetermined interval from the first gate line 110. The second gate pad 140 can be formed on the plurality of first dummy gates 120 with the thin insulating layer 112 interposed therebetween. The second gate pad 140 can connect with each of the second gate lines 130a and 130b, respectively, and can be gap-filled between the plurality of first dummy gates 120.

The first dummy gates 120 and the second gate pad 140 can be formed on a device isolation layer 201 in the peripheral circuit region 200. The first dummy gates 120 and second gate pad 140 can be used as a contact pad for the second gate lines 130a and 130b, respectively. The plurality of first dummy gates 120 can be formed in various patterns. In one embodiment, the plurality of first dummy gates 120 can be formed as an array of dummy gates 120 on each side of the gate line 110. The array of dummy gates 120 can be formed in, for example, a circular shape, a square shape, or a polygonal shape.

In a further embodiment, a second contact electrode 160 can be vertically connected with the second gate pad 140 and one or more dummy gates 120 to be electrically connected with the second gate line 130a. Another second contact electrode 160 can be vertically connected with the second gate pad 140 and one or more dummy gates 120 to be electrically connected with the second gate line 130b.

The first contact electrode 150 and the second contact electrodes 160 can be vertically connected with a power source line (not shown) for providing a predetermined voltage to the first gate line 110, the second gate line 130a, and the second gate line 130b. Embodiments of the subject invention can be incorporated in a memory device such as a DRAM.

The semiconductor device structure according to an embodiment of the present invention illustrated in FIGS. 2A and 2B shows a single First gate line 110, second gate lines 130a and 130b, first contact electrode 150, and second contact electrodes 160. In further embodiments, first gate line 110, second gate lines 130a and 130b, and contact electrodes 150 and 160 can be arranged in the form of a plurality of arrays of first gate line 110, second gate lines 130a and 130b, and contact electrodes 150 and 160.

Therefore, the semiconductor device according to an embodiment of the present invention can incorporate a first gate line 110 formed in the cell region 100 and the peripheral circuit region 200, second gate lines 130a and 130b of a spacer shape formed oil the sidewalls of the first gate line 110, and first and second contact electrodes 150 and 160 independently connected with each of the gate lines. The first contact electrode 150 can be vertically connected with the first gate line 110, and the second contact electrodes 160 can be connected with the second gate lines 130a and 130b through the plurality of first dummy gates 120 and the second gate pad 140 horizontally connected with the second gate lines 130a and 130b, respectively.

Accordingly, the semiconductor device according to the present invention can provide an area for a contact electrode to connect with a spacer shaped gate line among adjacent gate lines by first dummy gates 120 and a second gate pad 140 although a critical dimension (CD) of the gate line is reduced according to the high integration.

FIGS. 3A to 3E are views illustrating a method of manufacturing a semiconductor device according to an embodiment of the present invention.

The semiconductor device and the manufacturing method thereof according to an embodiment of the present invention will now be described with reference to FIGS. 3A to 3E.

Figure 3A:
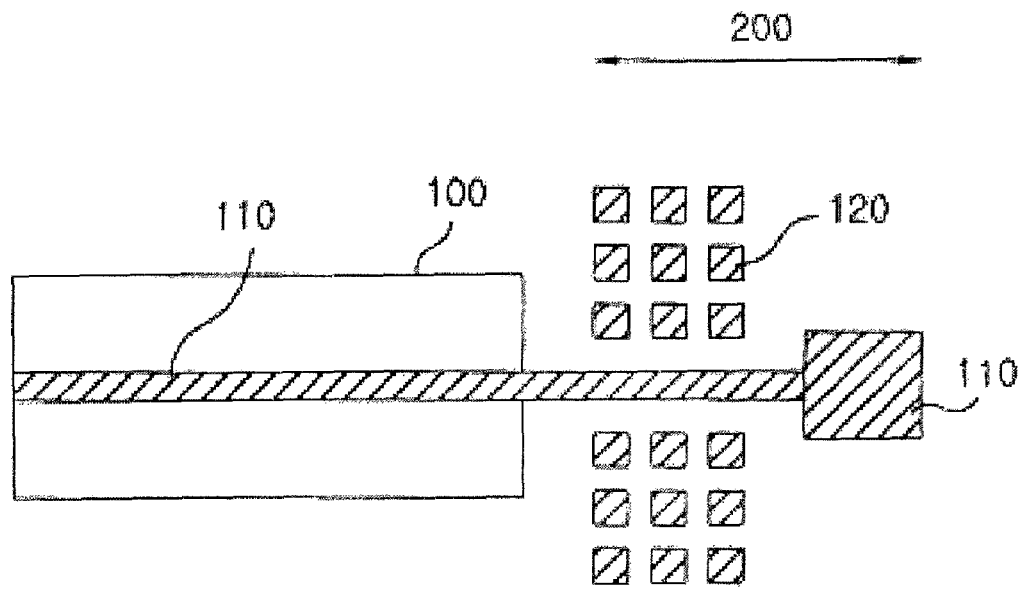
FIGS. 3A to 3E are views illustrating a semiconductor device and a manufacturing method thereof according to the present invention.

Referring to FIG. 3A, a device isolation layer (not shown) can be formed on a semiconductor substrate by a shallow trench isolation (STI) process to isolate an active region from an inactive region. In a specific embodiment, the semiconductor can be a silicon substrate. Next, a conductive layer can be formed in a cell region 100 and a peripheral circuit region 200 on the substrate. In one embodiment, the conductive layer can be a doped polysilicon layer. The conductive layer can be formed by a chemical vapor deposition (CVD) process, and then patterned to form a first gate line 110.

In an embodiment, the first gate line can have an end portion formed in the peripheral circuit region 200 that is wider than a width of the line. In particular, the end portion of the first gate line 110 can have a predetermined area for a contact with a first contact electrode 150 to be vertically connected with a line for receiving a voltage. A plurality of first dummy gates 120 can be formed in the peripheral circuit region 200 spaced at a predetermined interval from the gate line 110. The plurality of first dummy gates 120 can be formed as a pattern of dummy gates 120 in a circular shape, a square shape, or a polygonal shape adjacent the gate line 110.

In one embodiment, the first gate line 110 and the first dummy gates 120 can be formed simultaneously. In another embodiment, the first gate line 110 and the first dummy gates 120 can be formed sequentially.

In an embodiment, the first gate line 110 and the first dummy gates 120 can be formed of the same material.

Figure 3B:
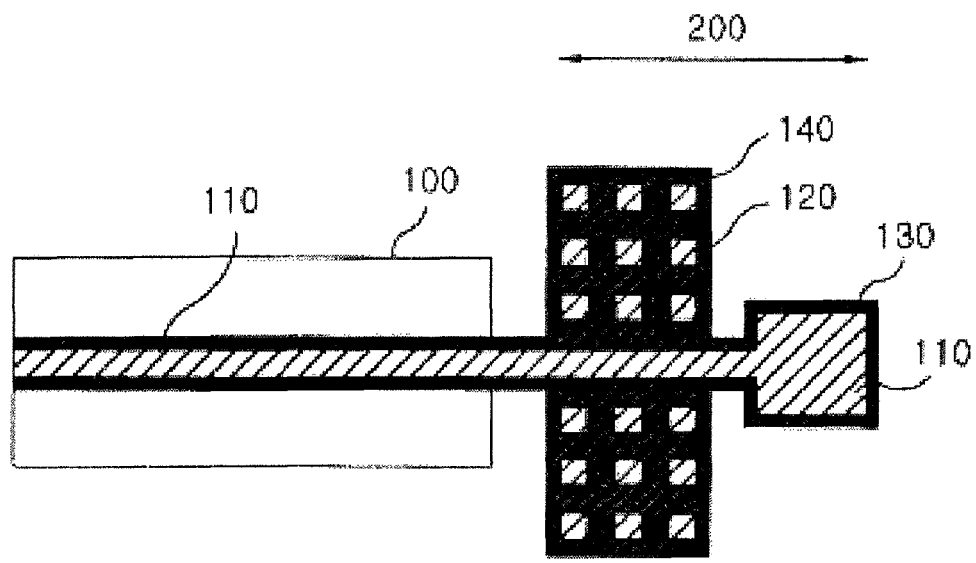
Figure 3C:
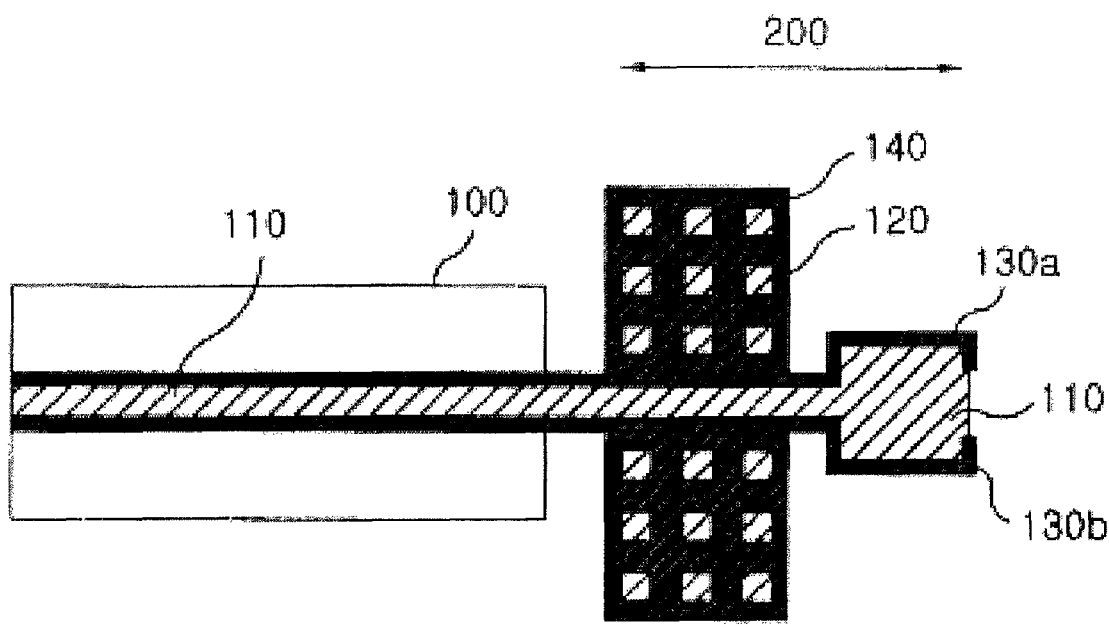
Figure 3D:
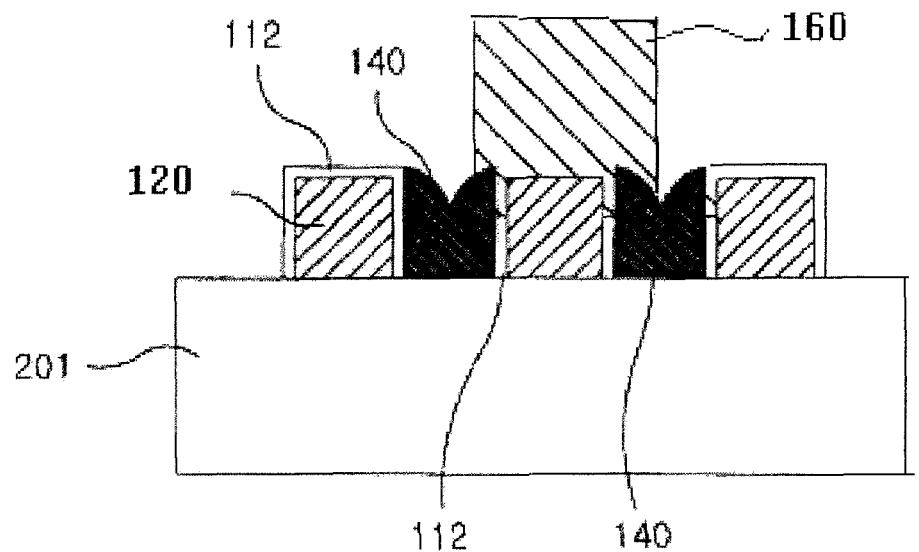

Referring to FIGS. 3B and 3D, a thin insulating layer 112 can be formed on the first gate line 110 and the first dummy gates 120. In a specific embodiment, the thin insulating layer 112 can be formed of silicon nitride (SiN). The insulating layer of silicon nitride can be formed by a CVD process or a physical vapor deposition (PVD) process.

Then, a second conductive layer can be deposited on the resulting structure. In a specific embodiment, the second conductive layer can be a doped polysilicon layer. The doped polysilicon layer can be dry-etched to form a second gate line 130 of a spacer shape on the thin insulating layer 112 on the sidewalls of the first gate line 110. In forming the second gate line 130, a second gate pad 140 horizontally connected with the second gate line 130 can be formed to gap-fill spaces between the first dummy gates 120.

In one embodiment, the second gate line 130 and the second gate pad 140 can be formed simultaneously. In another embodiment, the second gate line 130 and the second gate pad 140 can be formed sequentially.

In embodiments, the second gate line 130 and the second gate pad 140 can be formed of the same material.

Next, in a further embodiment as illustrated in FIG. 3C, the second gate line formed at the end portion of the first gate line 110 corresponding to a contact region can be selectively etched to separate second gate line 130 into second gate lines 130a and 130b separated from each other in the end portion of the first gate line 110.

That is, the second gate lines 130a and 130b can be formed on both sides of the first gate line 110, and can be electrically separated from each other. Accordingly, second gate line 130a and second gate line 130b can perform separate functions.

Figure 3E:
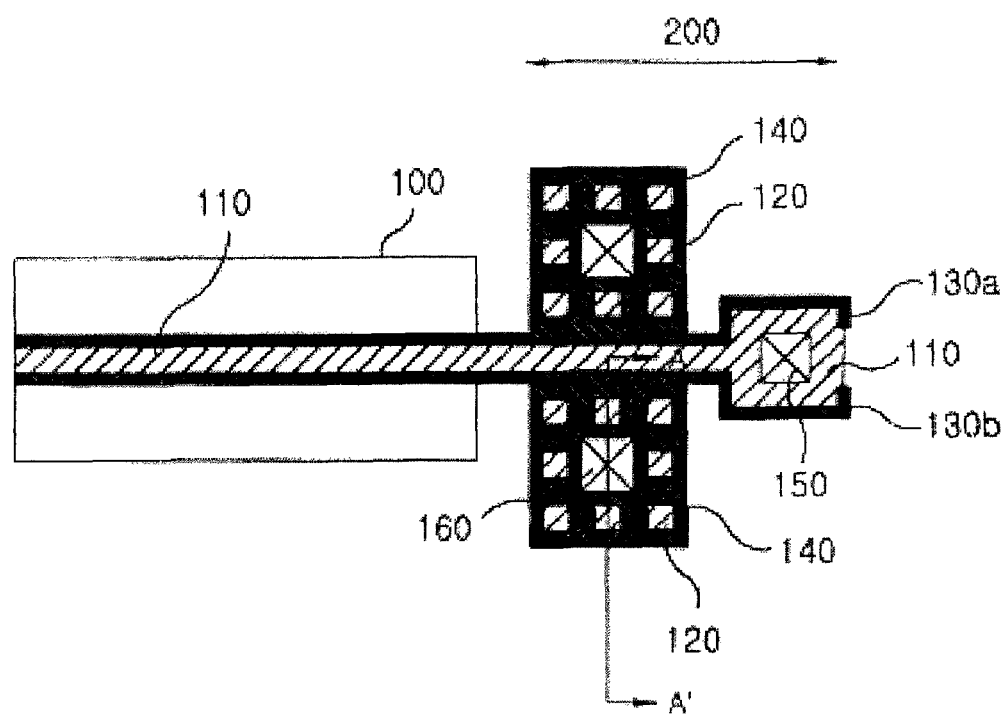

Next, as illustrated in FIGS. 3D and 3E, a third conductive layer can be deposited in the peripheral circuit region 200 on the substrate, and can be etched by a dry etching process to form a first contact electrode 150 vertically connected with the end portion of the first gate line 110. Simultaneously, second contact electrodes 160 can be formed vertically connected with one or more dummy gates 120 and a portion of the second gate pad 140 such that the second contact electrodes 160 can be electrically connected with second gate lines 130a and 130b, respectively. In a specific embodiment, the third conductive layer can be doped polysilicon. In another specific embodiment, the third conductive layer can be tungsten.

In an embodiment, the thin insulating layer 112 in a predetermined second contact region on the one or more first dummy gates 120 can be removed before forming the second contact electrode 160.

As illustrated above, the semiconductor device according to the present invention can incorporate gate lines of a spacer shape formed on a sidewall of a first gate line having a thin insulating layer interposed therebetween, and contact electrodes electrically connected with each of the gate lines having different critical dimensions. Therefore, a contact electrode region can be obtained so as to provide a sufficient voltage even to a gate line of a spacer shape having a reduced critical dimension according to the high integration of the semiconductor device.

It will be apparent to those skilled in the art that various modifications and variations can be made in the present invention. Thus, it is intended that the present invention covers the modifications and variations of this invention provided they come within the scope of the appended claims and their equivalents.

I claim:

1. A semiconductor device comprising:
    a first gate line formed on a semiconductor substrate;
    a first thin insulating layer formed on the sidewalls of the first gate line;
    a second gate line of a spacer shape formed on the first thin insulating layer at one sidewall of the first gate line;
    a third gate line of a spacer shape formed on the first thin insulating layer at the other sidewall of the first gate line;
    a first contact electrode vertically connected with the first gate line;
    first dummy gates formed on the semiconductor substrate adjacent a first side of the first gate line;
    a second thin insulating layer formed on the sidewalls of the first dummy gates;
    a second gate pad of a spacer shape formed on the second thin insulating layer filling gaps between the first dummy gates, wherein the second gate pad is electrically connected with the second gate line;
    second dummy gates formed on the semiconductor substrate adjacent a second side of the first gate line;
    a third thin insulating layer formed on the sidewalls of the second dummy gates;
    a third gate pad of a spacer shape formed on the third thin insulating layer filling gaps between the second dummy gates, wherein the third gate pad is electrically connected to the third gate line;
    a second contact electrode vertically connected with one or more of the first dummy gates and the second gate pad; and
    a third contact electrode vertically connected with one or more of the second dummy gates and the third gate pad.

2. The semiconductor device according to claim 1, wherein the first dummy gates are formed separated from each other in a first pattern and the second dummy gates are formed separated from each other in a second pattern.

3. The semiconductor device according to claim 2, wherein the first pattern and the second pattern are a circular shape, a square shape, or polygonal shape.

4. The semiconductor device according to claim 1, wherein the first dummy gates, the second dummy gates, the second gate pad, and the third gate pad are formed on an outer edge of the semiconductor substrate.

5. The semiconductor device according to claim 4, wherein the first dummy gates, the second dummy gates, the second gate pad, and the third gate pad are formed on a device isolation layer in the outer edge of the semiconductor substrate.

6. The semiconductor device according to claim 1, wherein the second gate line and the third gate line are electrically connected to each other.

7. The semiconductor device according to claim 1, wherein the first thin insulating layer formed on the sidewalls of the first gate line electrically isolates the second gate line and the third gate line from the first gate line.

* * * * *